(12) United States Patent
Brown

(10) Patent No.: US 7,343,577 B2
(45) Date of Patent: Mar. 11, 2008

(54) AREA ARRAY ROUTING MASKS FOR IMPROVED ESCAPE OF DEVICES ON PCB

(75) Inventor: Paul James Brown, Wakefield (CA)

(73) Assignee: Alcatel, Paris (FR)

( * ) Notice: Subject to any disclaimer, the term of this patent is extended or adjusted under 35 U.S.C. 154(b) by 170 days.

(21) Appl. No.: 11/224,012

(22) Filed: Sep. 13, 2005

(65) Prior Publication Data

US 2007/0057362 A1    Mar. 15, 2007

(51) Int. Cl.
*G06F 17/50* (2006.01)
(52) U.S. Cl. .......................................... 716/15; 716/11
(58) Field of Classification Search ...................... None
See application file for complete search history.

(56) References Cited

U.S. PATENT DOCUMENTS 5,729,467 A * 3/1998 Katsumata et al. ........... 716/15
6,584,608 B1 * 6/2003 Kumada et al. ............... 716/15
7,114,132 B2 * 9/2006 Yaguchi ........................ 716/1
2006/0112366 A1 * 5/2006 Wadland et al. .............. 716/11

* cited by examiner

*Primary Examiner*—Leigh M. Garbowski
(74) *Attorney, Agent, or Firm*—Jim Zegeer

(57) ABSTRACT

A method for optimizing area array device pin utilization and reducing the number of layers on a multilayered PCB comprising: preparing a package of BGA pin-out maps which anticipate the effect of existing fixed pins and derives the resulting optimum pin location assignment. Each pin-out map includes an indication of the best routing for circuits from a given component to be mounted to a PCB. Applying the package of pin-out maps during an area array pin assignment phase, thereby making an area array package capable of supporting the optimum routing configuration proposed by the pin-out maps. Applying the package of pin-out maps during a PCB design phase so that the optimum circuit routing to each pin is achieved, thereby completing the strategy layed out by the proposed pin-out maps, resulting in a lower number of PCB layers.

24 Claims, 6 Drawing Sheets

AREA ARRAY ROUTING MASKS FOR IMPROVED ESCAPE OF DEVICES ON PCB

REFERENCE TO RELATED PATENT APPLICATIONS

The present application is related to the following U.S. patent applications which are assigned to the assignee hereof:

Ser. No. 10/991,360 filed Nov. 19, 2004, inventor Paul Brown, entitled OFF-WIDTH PITCH FOR IMPROVED CIRCUIT CARD ROUTING;

Ser. No. 11/041,727 filed Jan. 25, 2005, inventor Alex Chan, entitled OFF-GRID DECOUPLING OF BALL GRID ARRAY (BGA) DEVICES;

Ser. No. 11/200,041 filed Aug. 10, 2005, inventor Paul Brown, entitled USING ROWS/COLUMNS OF MICRO-VIAS TO CREATE PCB ROUTING CHANNELS IN BGA INTERCONNECT GRID (Micro-Via Channels); and Ser. No. 11/200,044 filed Aug. 10, 2005, inventor Paul Brown, entitled ALTERNATING MICRO-VIAS AND THROUGHBOARD VIAS TO CREATE PCB ROUTING CHANNELS IN BGA INTERCONNECT GRID.

BACKGROUND AND BRIEF DESCRIPTION OF THE INVENTION

High pin count devices, typically in excess of 1900 pins at 1 mm pitch, are driving printed circuit boards (PCBS) to have upwards of 28 layers, which dramatically increases the cost of the card as well as increasing reliability problems, e.g. because such thick cards push through-hole board (THB) via technology to its limits resulting in manufacturing defects and failures caused by thermal expansion of the cards. In fact, for a typical circuit board, a 25% increase in the number of layers from 20 to 25 results in a 100% cost increase for example.

Furthermore, although the cost of a circuit board is typically only about 14% of the printed board assembly (PBA) cost, the cost of a failed PCB is 100% of the PBA cost. This is because the entire PBA is usually scrapped when the PCB fails. Therefore, reducing the number of PCB failures saves more than just the cost of the PCB, which in the case of a 28 layer board is already a very significant cost savings.

In addition, since PCB design is typically at the tail end of the PBA design process extra layers are often added to the PCB design to accommodate deficiencies in earlier stages of the PBA design. This practice further adds to the layer count, hence the cost, of a PCB. In fact, it is often a single component, usually a high pin count application specific integrated circuit (ASIC), that determines the maximum layer count of a PCB.

In view of the foregoing, there is a need to provide a method of designing PCBs with lower layer counts, thereby reducing the manufacturing cost of PCBs while improving their reliability, which will also lead to cost savings with respect to PBA failures.

PRIOR ART

High pin count custom devices such as ASICs usually determine the maximum layer count on a PCB. This in turn is usually determined by the pin-out of these devices because the pin-outs affect how easily the signals can be routed on the PCB. However, since little or no guidance to this effect is provided at the pin-out determination stage, each device pin-out is usually sub-optimal in terms of ease of routing the PCB. The only criteria that are usually considered are electrical or internal ASIC routing issues. Granted, these criteria are often more important than PCB routing, especially if they affect the operation of the ASIC. However, where multiple pin-out options exists that are equivalent under these criteria, there exists an opportunity to consider PCB routing issues, and possibly reduce the PCB layer count provided that some guidance is given to this end.

It is an object of this invention to provide a system and method for optimizing the I/O pin usage of the PC board to thereby reduce the number of layers in a PC board. A further object of the invention is to provide an improved PCB design in which the pin-out of the PCB is improved without affecting the functionality thereof.

The invention features a method for optimizing area array device pin utilization and reducing the number of layers on a multilayered PCB comprising:

Preparing a package of BGA pin-out maps which anticipate the effect of existing fixed pins and derives the resulting optimum pin location assignment. The package of pin-out maps, in which each pin-out map includes an indication of the best routing for circuits from a given component to be mounted to a PCB.

The said package of pin-out maps are also applied during the area array pin assignment phase, thereby making the area array package capable of supporting the optimum routing configuration proposed by the pin-out maps.

Applying said package of pin-out maps during a PCB design phase so that the optimum circuit routing to each pin is achieved, thereby completing the strategy layed out by the proposed pin-out maps, resulting in a lower number of PCB layers.

The invention further features the method discussed above wherein at least one of the pin-out maps shows areas of equal routing ease of escape for a selected device.

The invention further features the method discussed above wherein at least one of said pin-out maps proposes areas within the area array to be left functionless so as to create channels (rows/columns) to aid in the efficient escape of a selected device type.

The invention further features the method discussed above wherein at least one of said pin-out maps provides the designer/packaging house (ASIC/FPGA vendor) with the necessary pin-out information to make the area array pin grid compatible with said solution.

The invention further features the method discussed above wherein at least one of said pin-out maps provides the PCB designer with the necessary routing information to leverage the pin-out configurations imparted above.

The invention further features an automated tool/computer script which enables the methods detailed above.

The invention further features an area array device (BGA) made in accordance with the methods defined above.

Finally, the invention features a PCB made in accordance with the method defined above.

BRIEF DESCRIPTION OF THE DRAWINGS

The above and other objects, advantages and features of the invention will become more apparent when taken in conjunction with the following specification and accompanying drawings wherein.

DETAILED DESCRIPTION OF THE INVENTION

The invention provides package pin-out maps and a method of determining them. Each of the maps shows areas of equal routing ease for a given package type. Like areas are coded with the same color for manual pin-out determination, whereas they would have like numeral priority for an automated procedure. When determining the pin-out of a device, the areas of easiest routability are used first, and then areas of successively less routability as needed until all pin placements have been assigned. Some locations are predefined, such as power and ground pins, as well as high speed buses, clocks, etc. Areas of easiest routability are generally at the periphery of the package and ease of routability lessens towards inward layers barring any obstacles such as the aforementioned predefined locations. Maps can also be provided for no-connect (NC) pins to create channels for routing signal traces.

As an example, a study was done on a typical PCB. With a worst case pin-out the PCB had 20 layers, which resulted in a $300 manufacturing cost. If the pin-out had been chosen randomly, the PCB would have needed 14 layers and cost $100 to produce. Applying the package pin-out maps, the layer count was reduced to only 8 layers, which resulted in a manufacturing cost of $20. This results in significant savings in layer count and cost relative to using a random pin-out.

Figure 1A:
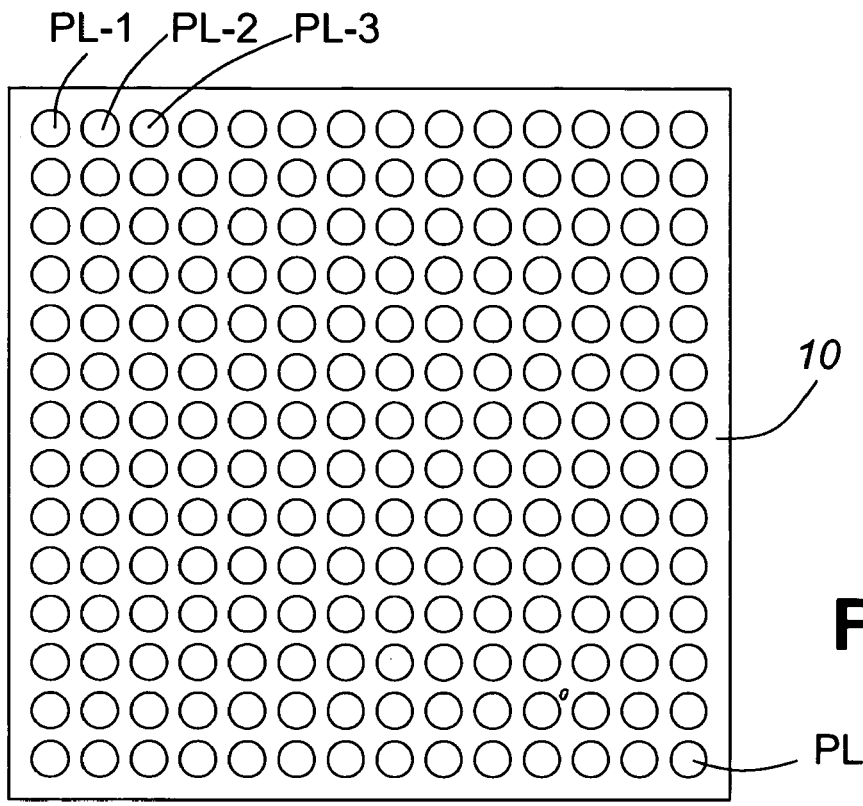
FIG. 1a is an illustration of a blank area array (BGA) pin field or map.
Figure 1B:
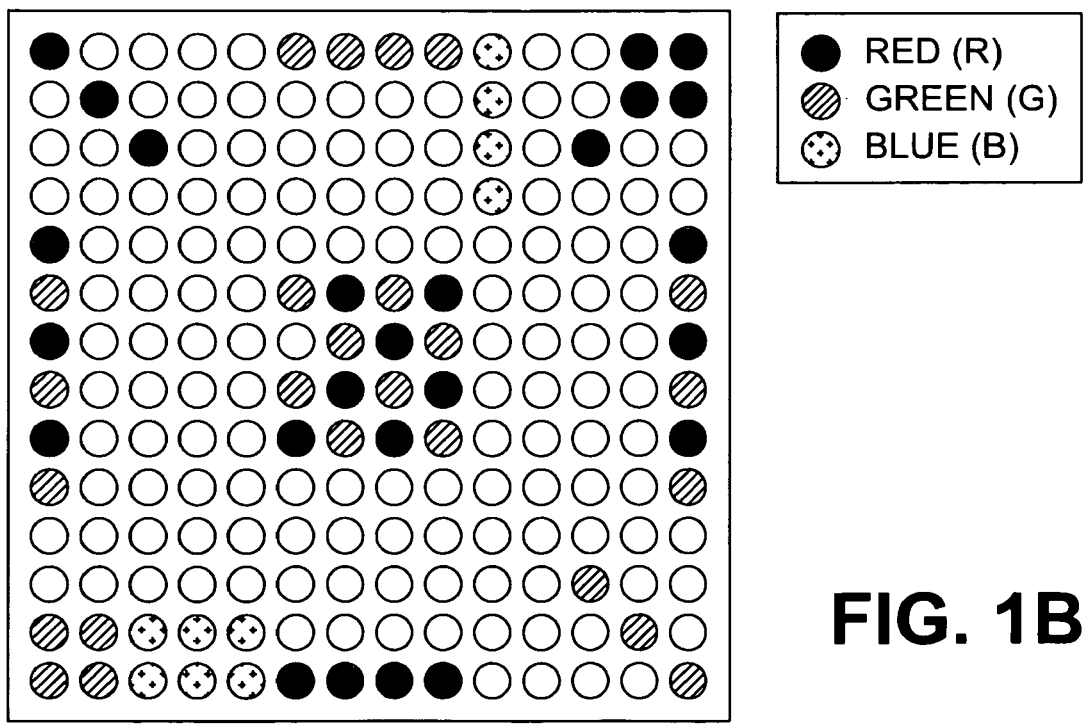
FIG. 1b is an illustration of an area array (BGA) pin field or map with mandatory fixed pin locations identified.
Figure 1C:
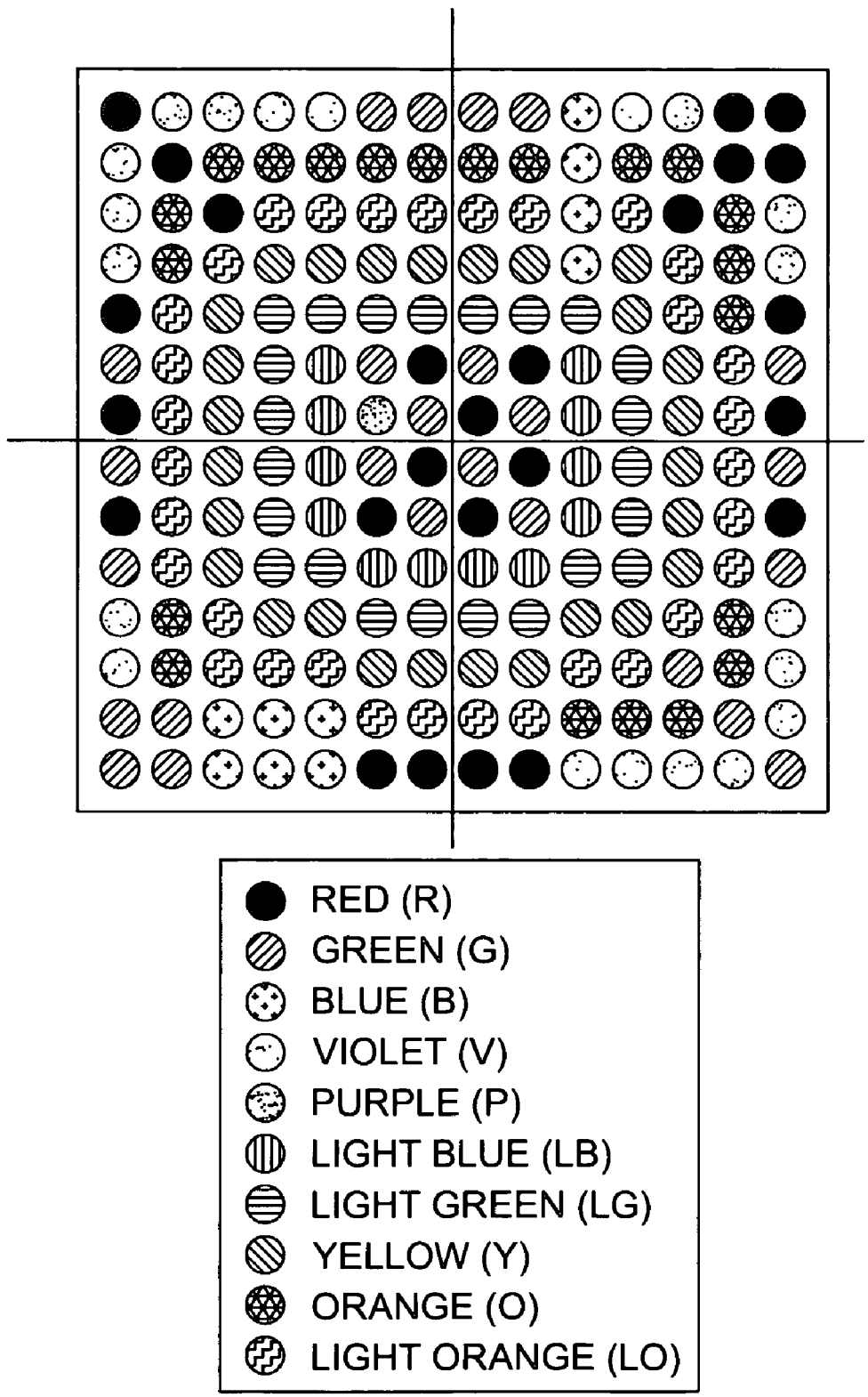
FIG. 1c is an illustration of an area array (BGA) pin field (map) with the remaining pins identified in the order of their routability respecting the fixed pins identified in FIG. 1b.

Referring to FIG. 1a, an area array (BGA) pin field or map 10 for a BGA device with the pin locations PL-1, PL-2 PL-3-PL-n are blank or not assigned. FIG. 1b shows the pin field map with mandatory fixed pin locations. For example pin locations designated by Rs (red) may be reserved for power input and those designated with Gs (green) may be reserved for ground connections. The pins designated by Bs (blue) may be reserved for highspeed buses, clocks, etc. FIG. 1c shows the area array pin field map with the remaining pins identified in the order of their routability with respect to pins previously reserved in FIG. 1b. Keeping in mind that pin field areas of easiest routability are generally at the periphery, the pin locations remaining in the periphery may be designated with a V (violet), The next most outer pin locations may be designated Os (orange) and LB (light brown). The remaining pins in the next most inner row of remaining pin locations may be designated with LBs and Ys (yellow). The next most inner row may be designated with Ys and LGs (light green). The next most row of remaining pin locations may be designated LGs and LBs (light blue). The remaining pins in the field may be designated by Ps (purple). Routability rankings not using color may be used.

Figure 2A:
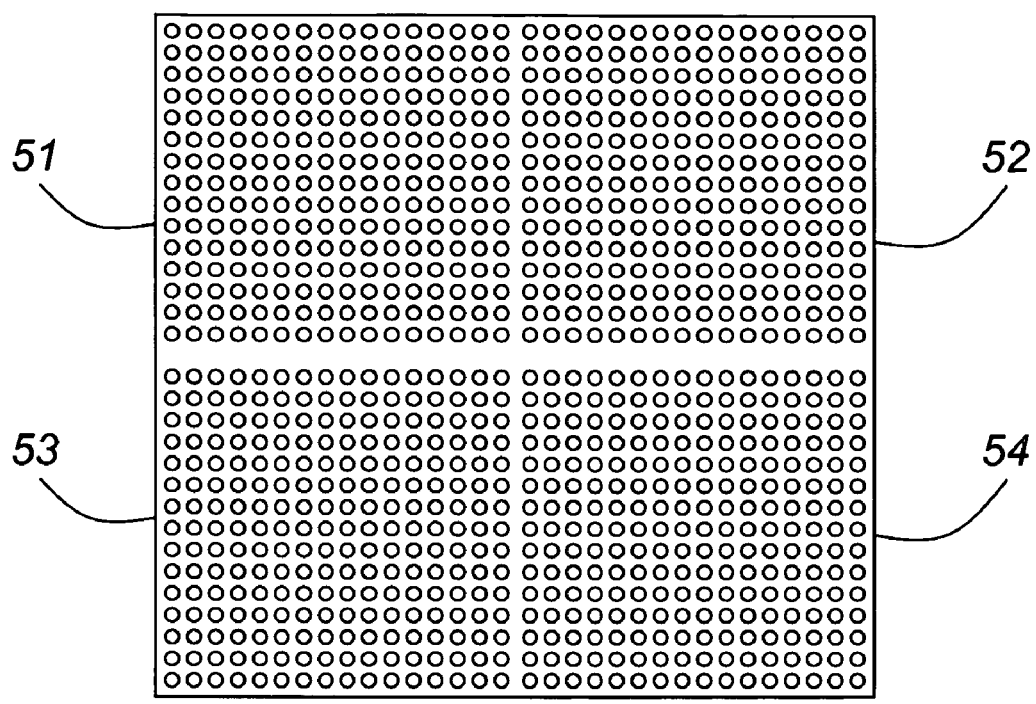
FIG. 2a is an illustration of a blank area array pin field (map) wherein the pin field may be divided into four sectors.
Figure 2B:
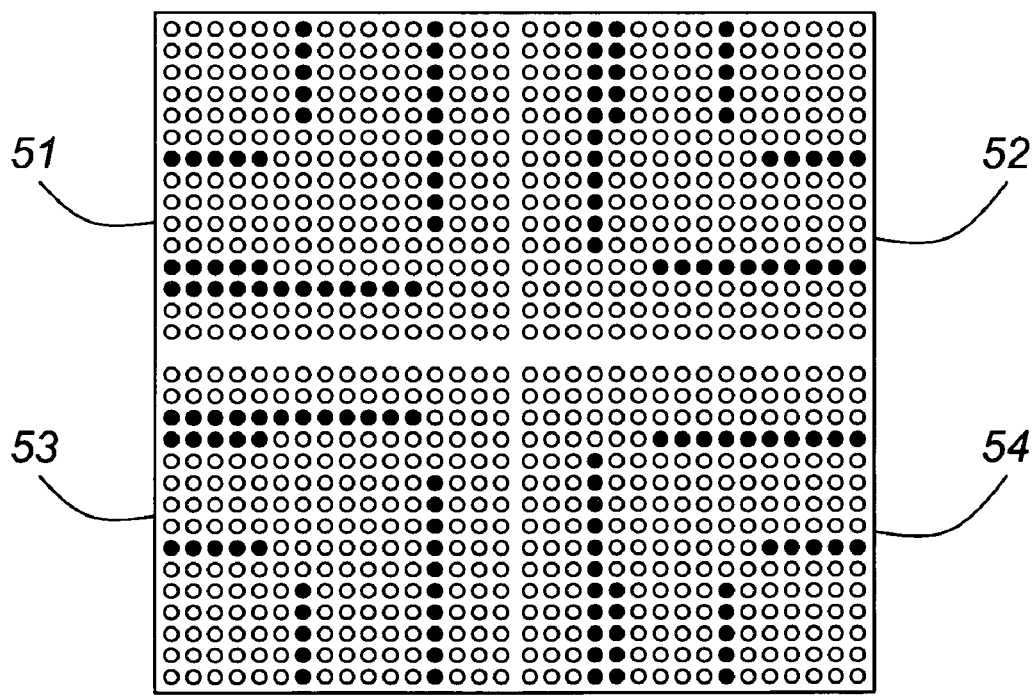
FIG. 2b is an illustration of an area array (BGA) pin field map with suitable pins identified in locations of potential routing channels.
Figure 2C:
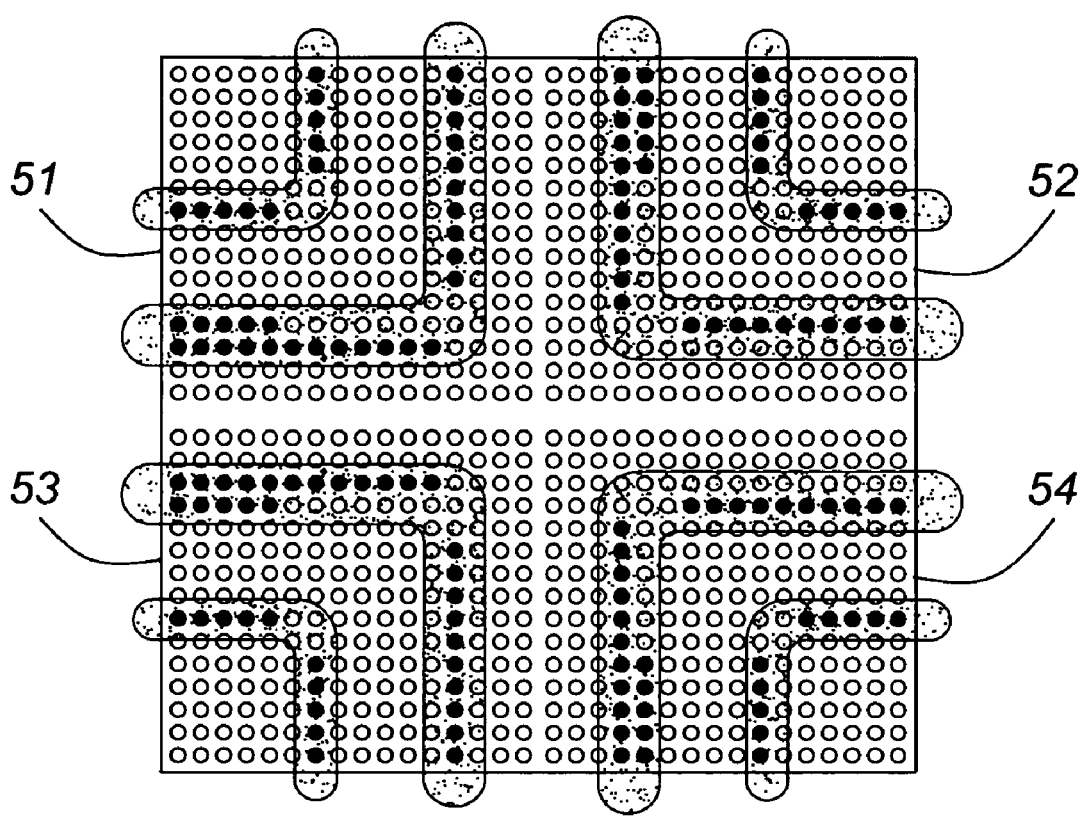
FIG. 2c is an illustration of an area array (BGA) pin field map with routing channel zones identified.
Figure 2D:
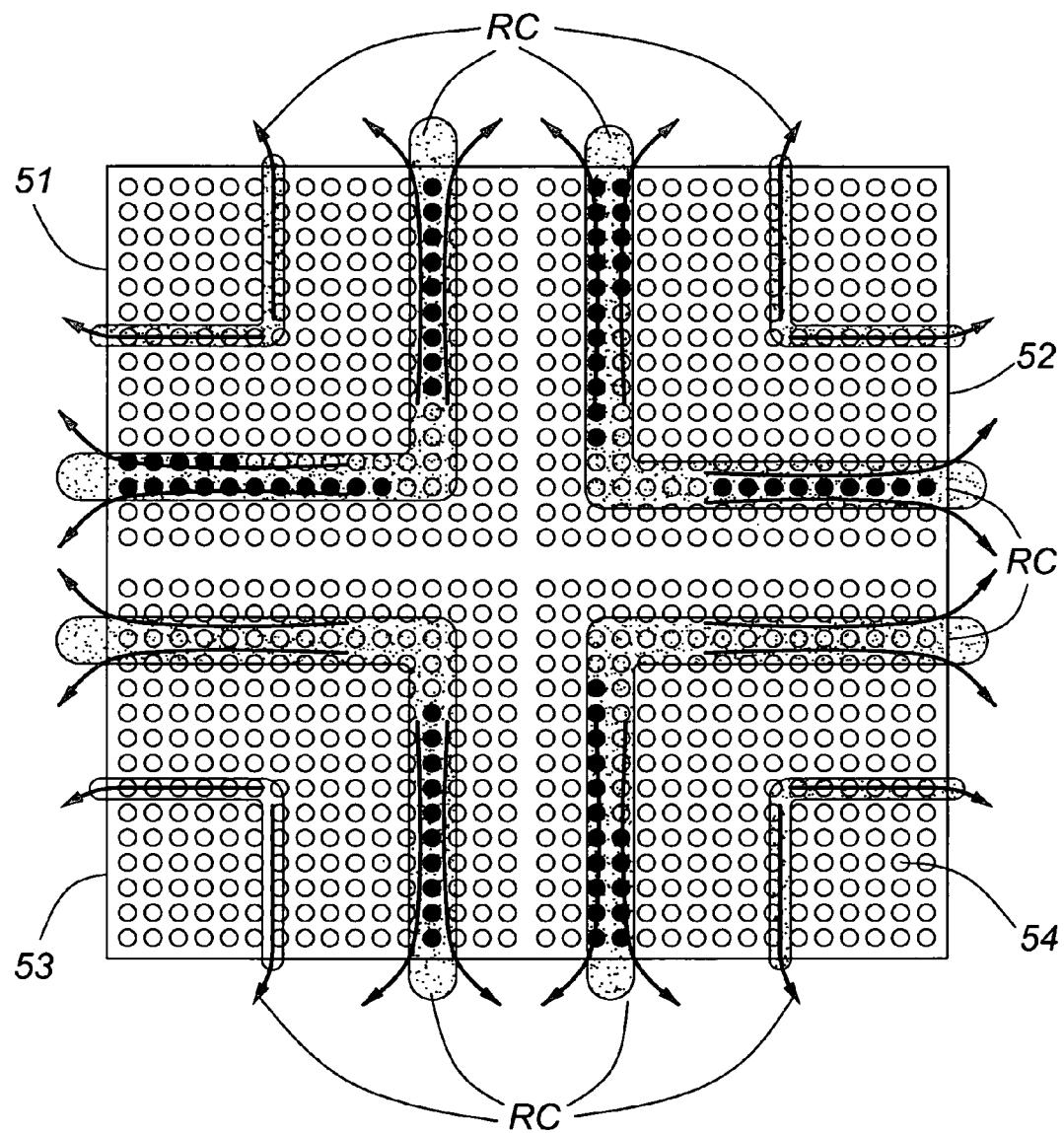
FIG. 2d is an illustration of an area array (BGA) pin field map with routing channels in place and serving to escape the array from inside out.

Referring now to FIGS. 2a-2d, FIG. 2a shows a blank area array for a BGA device with its pin field 11 divided into four sectors, 51, 52, 53, 54, each of which in this example are treated in the same fashion. In FIG. 2b, suitable pin fields are identified in each sector as locations of potential routing channels. These pins may be designated as no connects or surface routing only pins to enable channel formation. FIG. 2c illustrates an area array (BGA) pin field with routing zones identified. These zones will channel a higher density of routing lines to increase the escape efficiency of the array. Finally, FIG. 2d shows an area array pin field with routing channels RC in place, serving to escape the array from the inside-out. It should be noted that all of these channels are needed to achieve the desired result.

Figure 3:
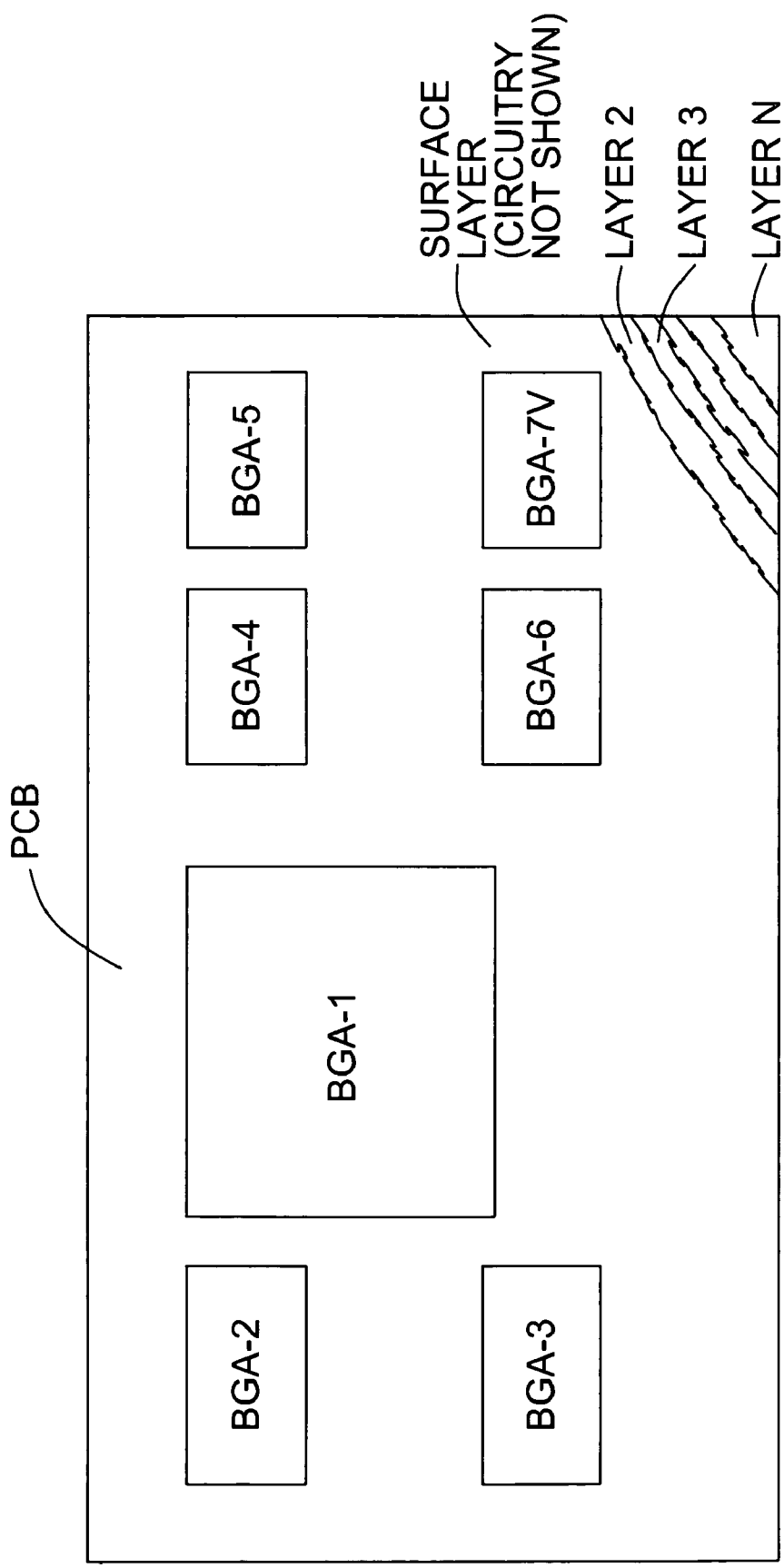
FIG. 3 is an illustration of a printed circuit board with reduced layers made in accordance with the method of this invention.

After the package of BGA pin-out maps are prepared as described above, package of pin-out maps are applied during the area array pin out assignment phase, thereby area array package capable of supporting the optimum routing configuration proposed by the pin-out maps. The package of pin-out maps are then applied during the PCB design phase so that optimum circuit routing to each pin is achieved, thereby completing the strategy laid out by the pin-out maps, resulting in a lower number of PCB layers. FIG. 3 shows such a PCB having BGA device (BGA-1, BGA-2, BGA-3, BGA-N, with pin lay outs as discussed above, mounted thereon and reduced layer count (surface layer (circuitry not shown), layer-2, layer-3, layer-N).

ADVANTAGES OF THE INVENTION lowering PCB layer count saves manufacturing cost of the PCB, increases reliability of the PCB (e.g. less stress on THB vias)

lowering PCB cost also results in lower costs of PBA failures

There has been disclosed and described a system for reducing the number of layers in a PC board and optimizing the pin usage of PC boards predicated on preparing a package of pin-out maps, each pin-out map showing areas of equal routing choices for selected devices of the type used in the PC board, using or applying the PC package of pin-out maps during PC board design phase so that the optimum circuit routing for each layer is achieved thereby resulting in a lower number of PCB layers.

The invention has wide applicability to electronic systems in general. Even if a reduction of 2 (even 1) layers in out of every 10 PCB designs could have been achieved, a significant savings in PCB spending can be realized. This amount of reduction in layer count is well within the improvement provided by the invention according to example PCB studies.

While the invention has been described in relation to preferred embodiments of the invention, it will be appreciated that other embodiments, adaptations and modifications of the invention will be apparent to those skilled in the art.

What is claimed is:

1. A method for optimizing area array device pin utilization and reducing the number of layers on a multilayered PCB comprising:

preparing a package of BGA pin-out maps which anticipate the effect of existing fixed pins and derives the resulting optimum pin location assignment, each pin-out map in said package of pin-out maps includes an indication of the best routing for circuits from a given component to be mounted to a PCB, applying said package of pin-out maps during the area array pin assignment phase, thereby making an area array package supporting the optimum routing configuration indicated by the pin-out maps, applying said package of pin-out maps during a PCB design phase so that the best circuit routing solution to each pin is achieved, thereby completing the pin locations layed out by said pin-out maps, resulting in a lower number of PCB layers.

2. A method defined in claim 1 where at least one of said pin-out maps shows areas of equal routing ease of escape for a selected device.

3. A method defined in claim 1 where at least one of said pin-out maps shows areas within the area array to be left functionless so as to create channels (rows/columns) to aid in the efficient escape of a selected device type.

4. A method defined in claim 1 wherein at least one of said pin-out maps provides a designer and/or a packaging house with the necessary pin-out information to make the area array pin grid compatible with a solution.

5. The method defined in claim 1 wherein at least one of said pin-out maps provides a PCB designer with the necessary routing information to leverage the pin-out configurations.

6. An automated tool/computer script which enables the methods defined in claim 1.

7. An area array device (BGA) made in accordance with the methods defined in claim 1.

8. A PCB made in accordance with the method defined in claim 1.

9. Method for optimizing area array device pin utilization and reducing the number of layers on a multilayered PCB comprising:

preparing a package of BGA pin-out maps which anticipate the effect of existing fixed pins and derives the resulting optimum pin location assignment, each said pin-out map in said package of pin-out maps includes an indication of the best routing for circuits from a given component to be mounted to a PCB, and applying said package of pin-out maps during an area array pin design phase, thereby making the area array package support the optimum routing configuration indicated by said pin-out maps.

10. Method defined in claim 9 where at least one of the pin-out maps shows areas of equal routing ease of escape for a selected device.

11. Method defined in claim 9 where at least one of said pin-out maps proposes areas within the area array to be left functionless so as to create channels (rows/columns) to aid in the efficient escape of a selected device type.

12. A method defined in claim 9 wherein at least one of said pin-out maps provides a designer/packaging house (ASIC/FPGA vendor) with the necessary pin-out information to make the area array pin grid compatible therewith.

13. The method defined in claim 9 wherein at least one of said pin-out maps provides a PCB designer with the necessary routing information to leverage the pin-out configurations.

14. An area array device (BGA) made in accordance with the method defined in claim 9.

15. Method for optimizing area array device pin utilization and reducing the number of layers on a multilayered PCB comprising:

preparing a package of BGA pin-out maps which anticipate the effect of existing fixed pins and derives the resulting optimum pin location assignment, each pin-out map in said package of pin-out maps, includes an indication of the best routing for circuits from a given component to be mounted to a PCB, and applying said package of pin-out maps during a PCB design phase so that the optimum circuit routing to each pin is achieved, thereby completing the pin locations layed out by the proposed pin-out maps resulting in a lower number of PCB layers.

16. Method defined in claim 15 where at least one of the pin-out maps shows areas of equal routing ease of escape for a selected device.

17. Method defined in claim 15 where at least one of said pin-out maps indicates areas within the area array to be left functionless so as to create channels (rows/columns) to aid in the efficient escape of a selected device type.

18. A method defined in claim 15 wherein at least one of said pin-out maps provides a designer/packaging house (ASIC/FPGA vendor) with the necessary pin-out information to make the area array pin grid compatible therewith.

19. The method defined in claim 15 wherein at least one of said pin-out maps provides a PCB designer with the necessary routing information to leverage the pin-out configurations.

20. A PCB made in accordance with the method defined in claim 15.

21. A method for reducing the number of layers and optimizing the pin utilization on a layered PCB (printed circuit board) comprising:

preparing a package of pin-out maps, each said pin-out map including an indication of the best routing for circuits from a given component to be mounted on the PCB;

applying said package of pin-out maps during a PCB design phase so that the optimum circuit routing to each pin-out is achieved thereby resulting in a lower number of PCB layers.

22. The method defined in claim 21 wherein at least one of said pin-out maps shows areas of equal routing ease of escape for a selected device type.

23. The method defined in claim 21 wherein at least one of said pin-out maps provides the PCB designer with routing information.

24. A PCB made according to the method defined in claim 21.

* * * * *